United States Patent
Gruening-Von Schwerin et al.

(10) Patent No.: US 7,463,507 B2
(45) Date of Patent: Dec. 9, 2008

(54) MEMORY DEVICE WITH A PLURALITY OF MEMORY CELLS, IN PARTICULAR PCM MEMORY CELLS, AND METHOD FOR OPERATING SUCH A MEMORY CELL DEVICE

(76) Inventors: Ulrike Gruening-Von Schwerin, Adam-Berg Strasse 115e, München (DE) 81735; Thomas Happ, 31 Storm St. 2, Tarrytown, NY (US) 10591

( * ) Notice: Subject to any disclaimer, the term of this patent is extended or adjusted under 35 U.S.C. 154(b) by 0 days.

(21) Appl. No.: 11/269,898

(22) Filed: Nov. 9, 2005

(65) Prior Publication Data
US 2007/0103971 A1    May 10, 2007

(51) Int. Cl.
G11C 11/00    (2006.01)
G11C 11/14    (2006.01)
G11C 11/15    (2006.01)

(52) U.S. Cl. .................. 365/148; 365/158; 365/163; 365/171; 365/173

(58) Field of Classification Search .......... 365/158, 365/171, 173, 148, 163
See application file for complete search history.

(56) References Cited

U.S. PATENT DOCUMENTS

| | | | |
|---|---|---|---|
| 6,583,003 B1 | 6/2003 | Hsu et al. | |
| 6,740,921 B2 | 5/2004 | Matsuoka et al. | |
| 6,778,426 B2 * | 8/2004 | Hosotani | 365/158 |
| 7,061,790 B2 * | 6/2006 | Morimoto et al. | 365/158 |
| 7,095,648 B2 * | 8/2006 | Ditewig et al. | 365/158 |
| 7,110,289 B1 * | 9/2006 | Sin et al. | 365/173 |
| 7,116,595 B2 * | 10/2006 | Hidaka | 365/158 |
| 2004/0184331 A1 | 9/2004 | Hanzawa et al. | |
| 2004/0233748 A1 | 11/2004 | Terao et al. | |

FOREIGN PATENT DOCUMENTS

EP    1-486-985 A2    12/2004

OTHER PUBLICATIONS

Bedeschi, F. et al. (2005). "Set and Reset Pulse Characterization in BJT-Selected Phase-Change Memories," *IEEE*:1270-1273.

* cited by examiner

*Primary Examiner*—Trong Phan
(74) *Attorney, Agent, or Firm*—Dicke, Billig, Czaja PLLC

(57) ABSTRACT

The invention relates to a method for operating a memory device, and to a memory device with a plurality of memory cells (1) which each have at least one switching device (13) assigned thereto for controlling, as well as a current supply line and a current discharge line (11, 12), wherein said current supply line (11) and said current discharge line (12) are substantially parallel to each other.

26 Claims, 5 Drawing Sheets

Figure 6:
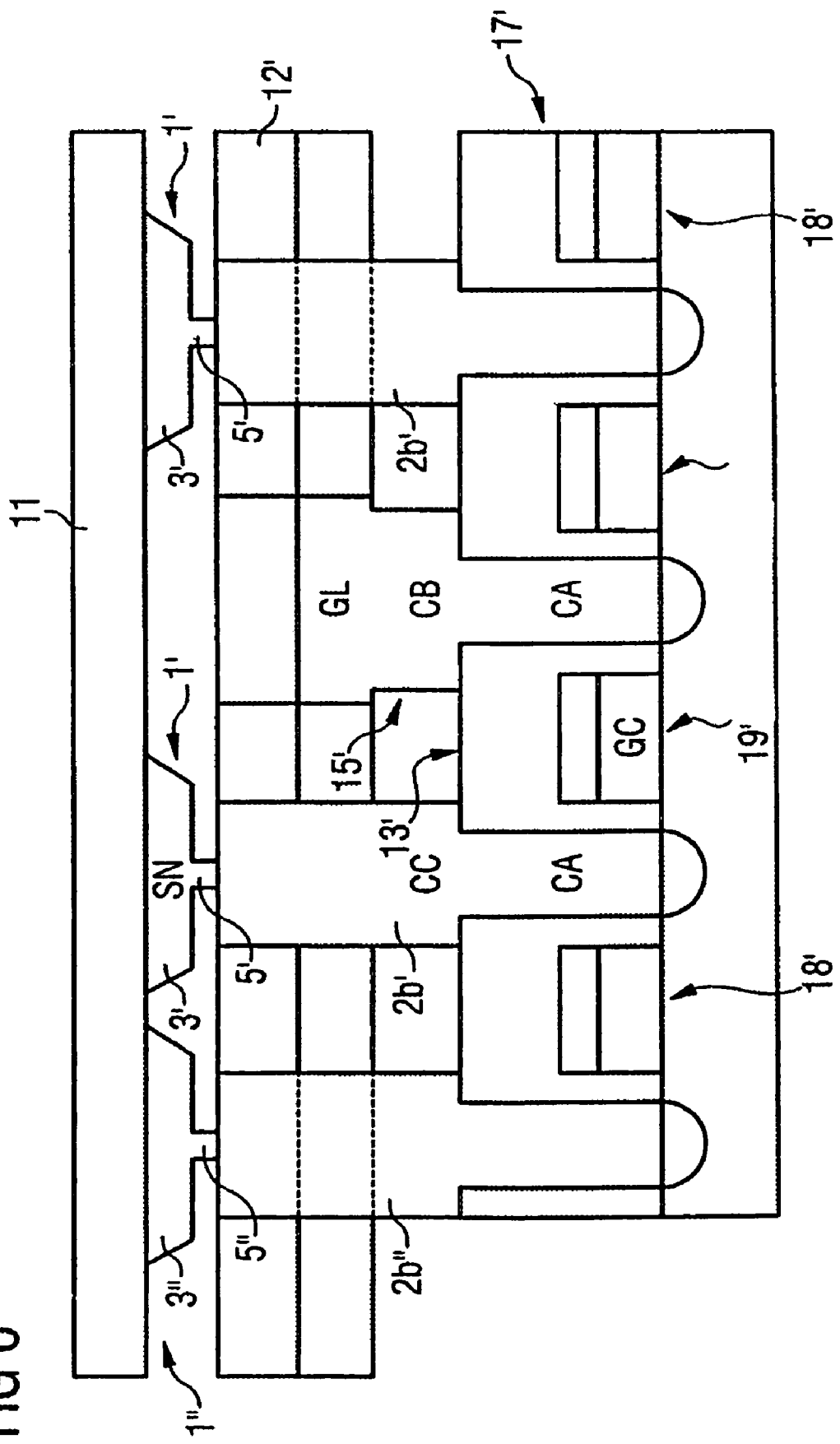

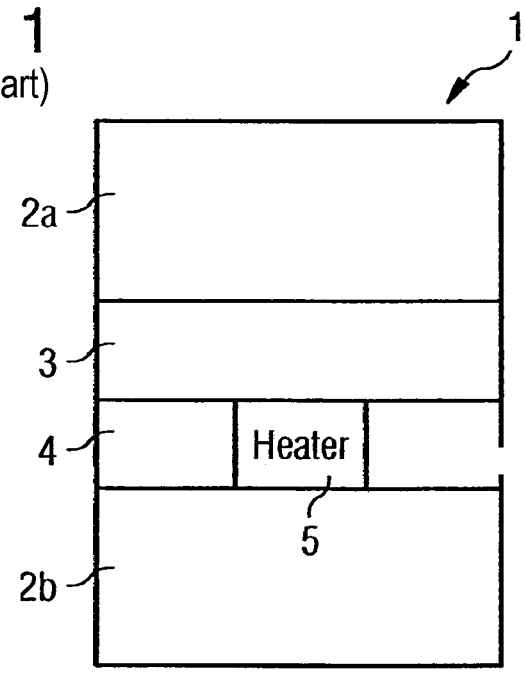
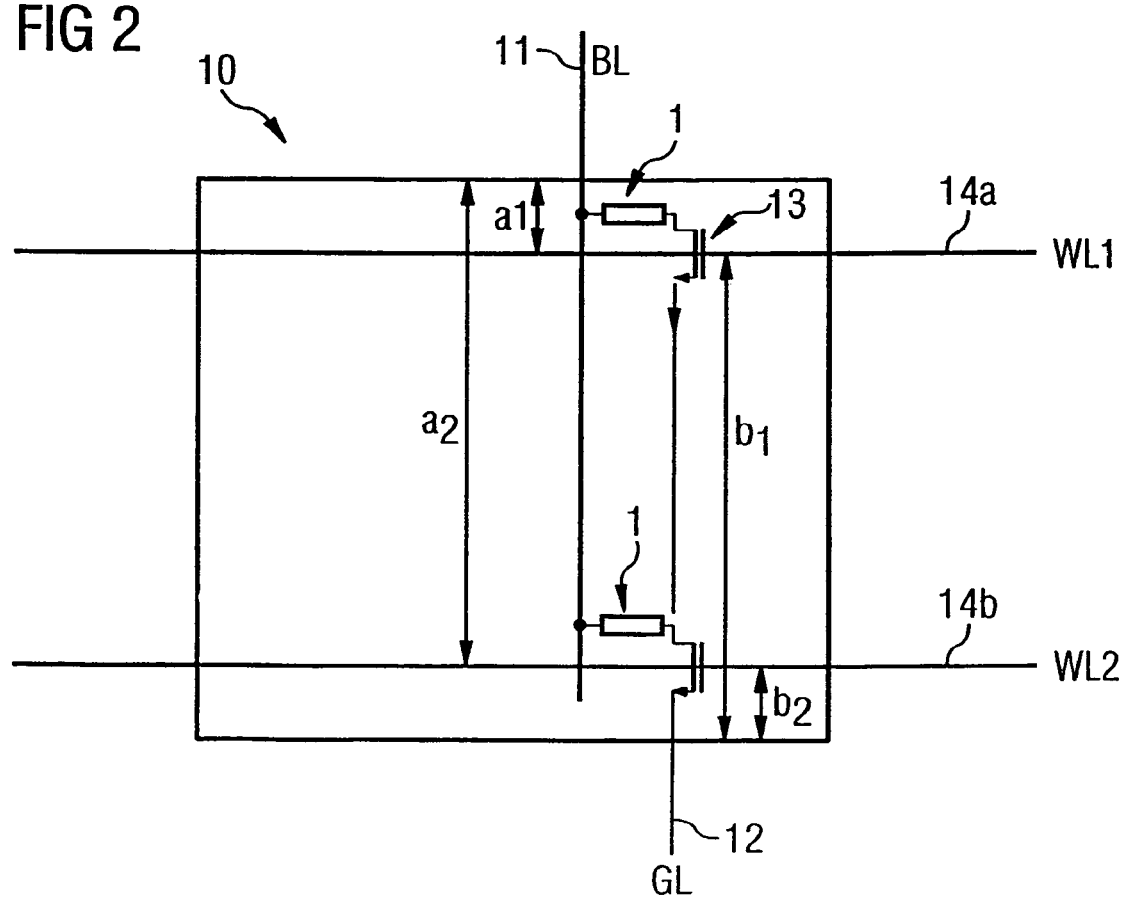

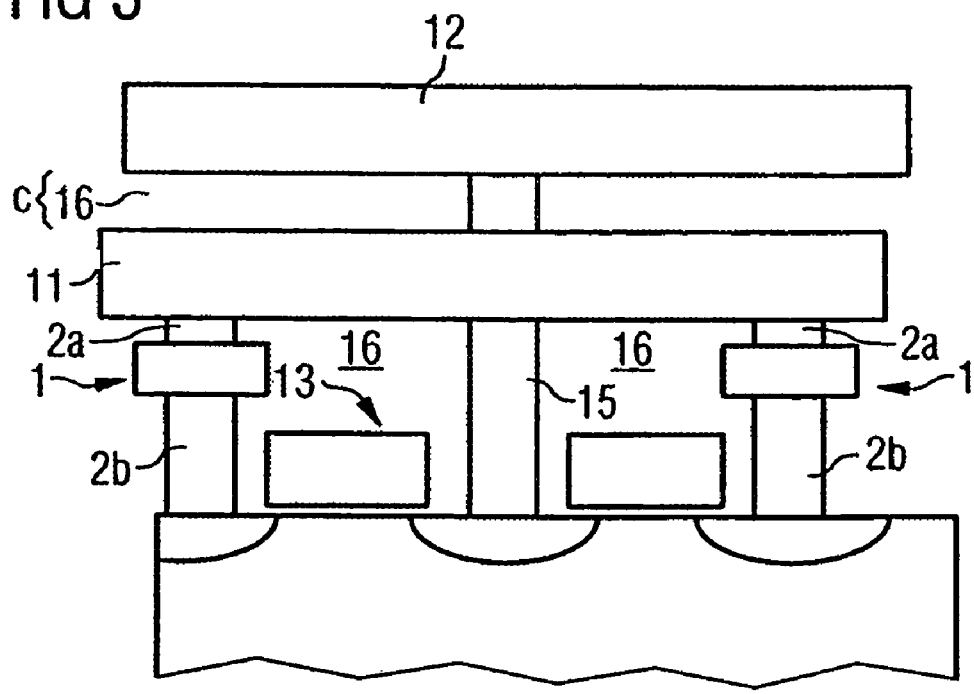
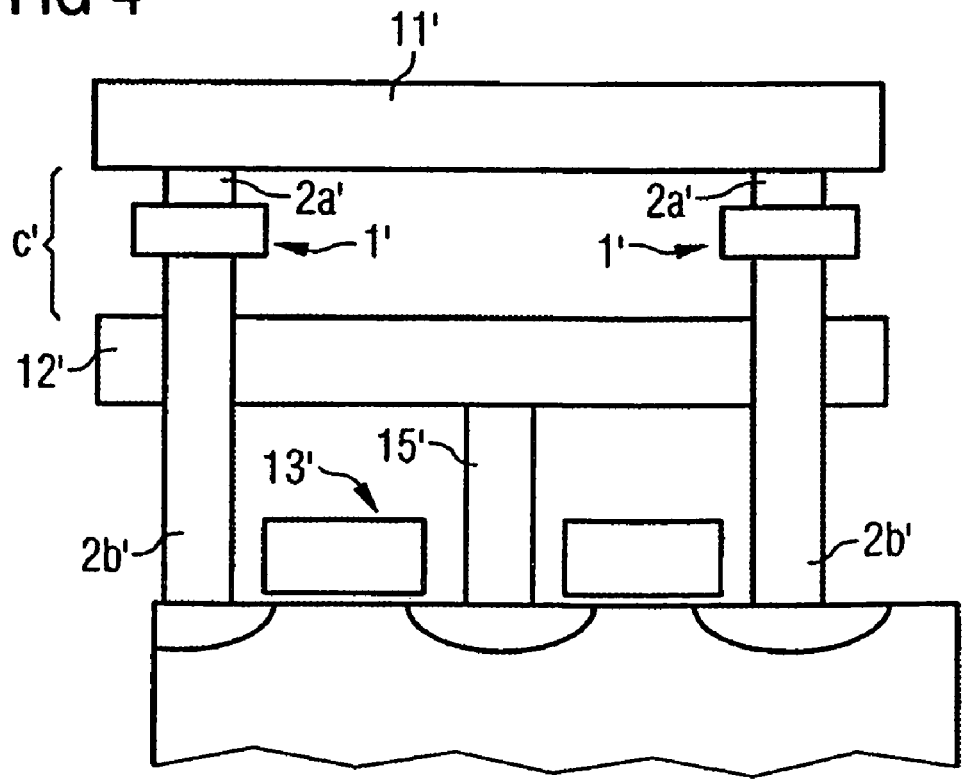

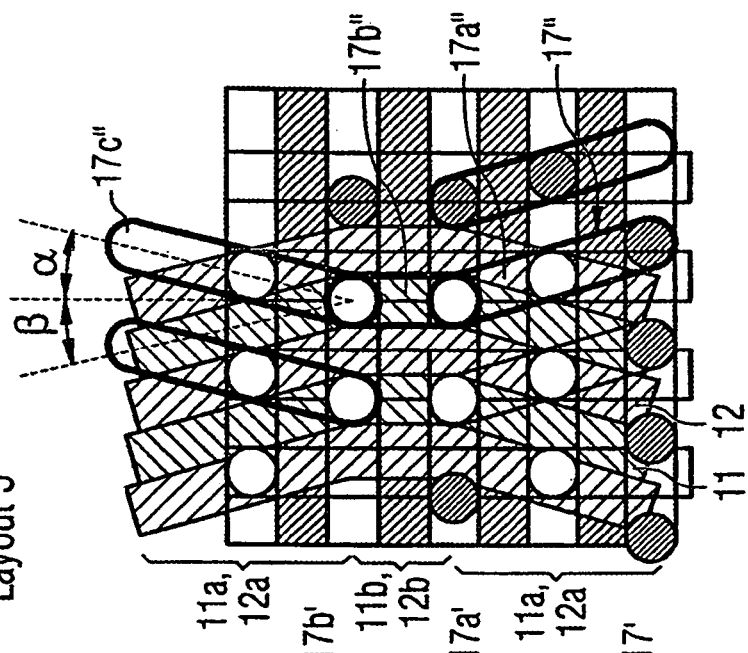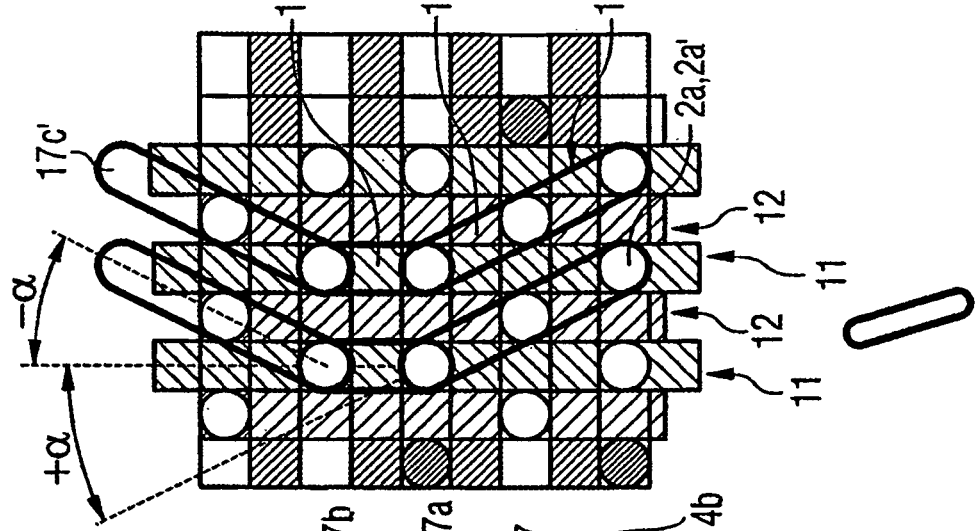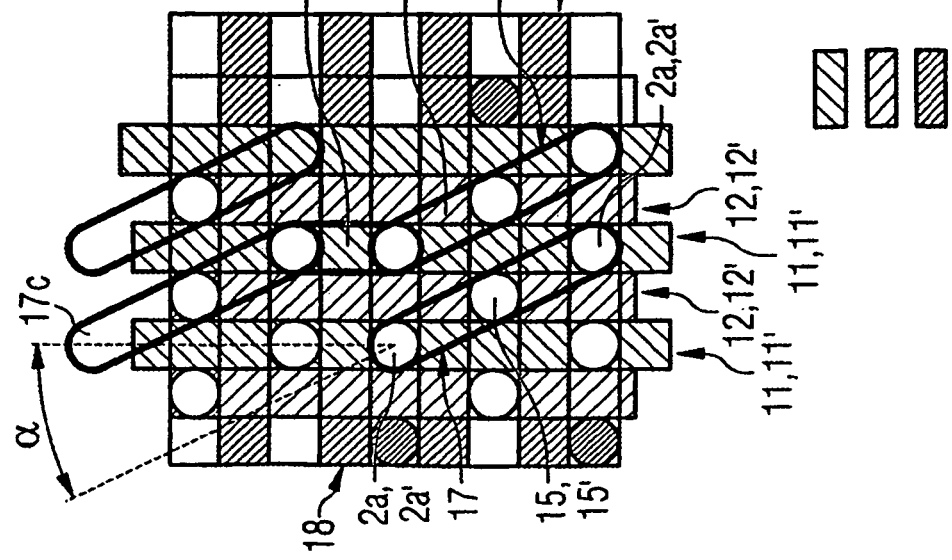

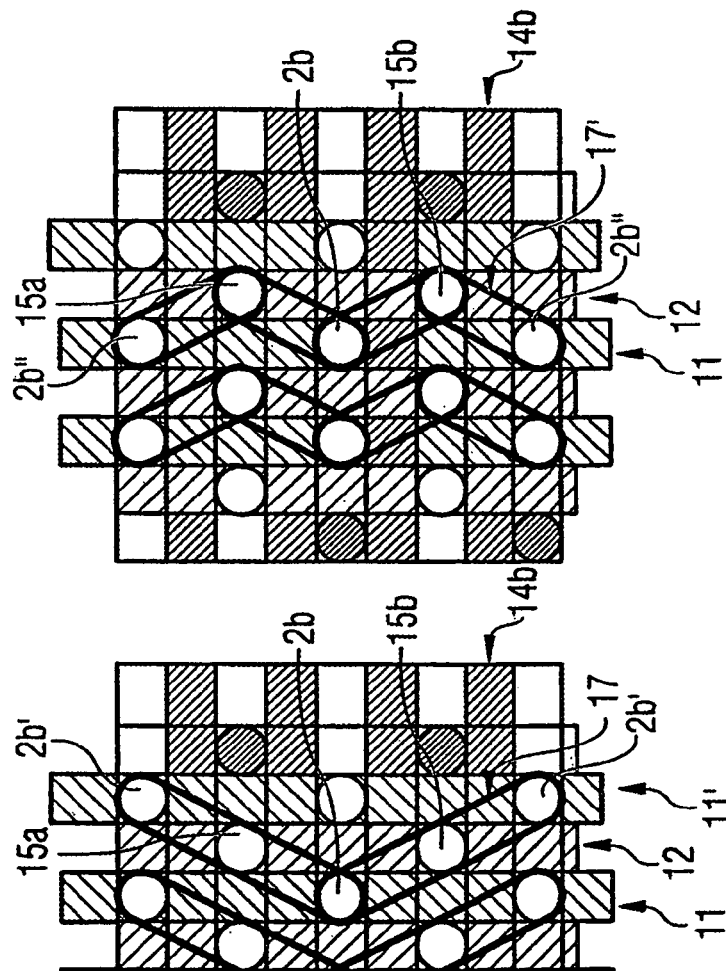
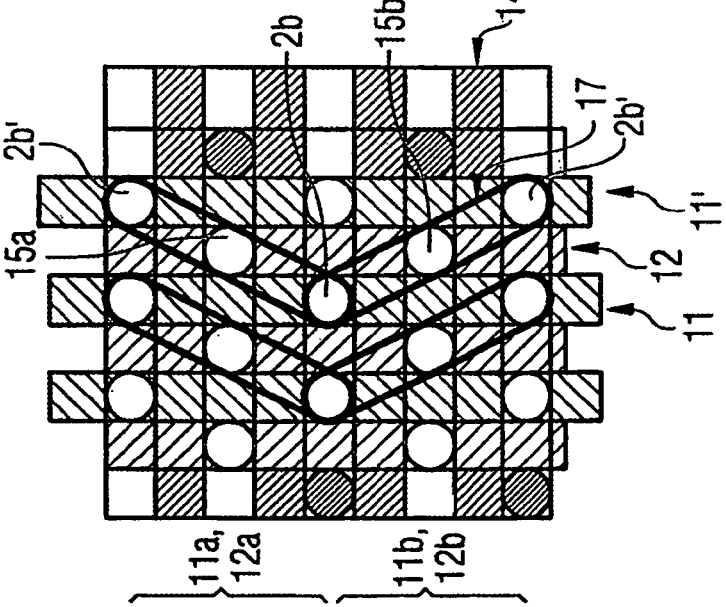
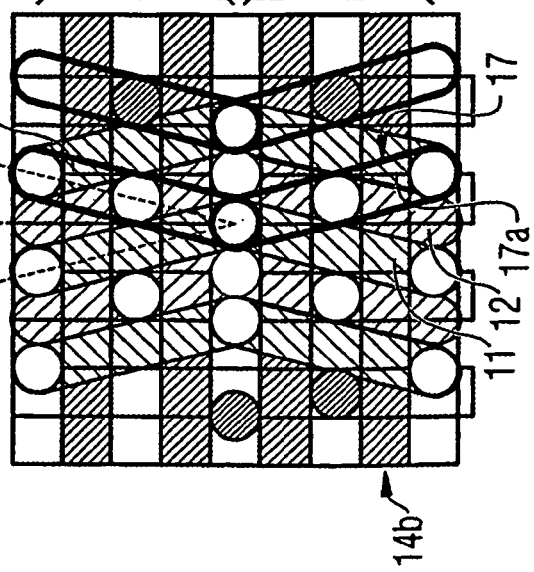
FIG 5D Layout 4
FIG 5E Layout 5
FIG 5F Layout 6

MEMORY DEVICE WITH A PLURALITY OF MEMORY CELLS, IN PARTICULAR PCM MEMORY CELLS, AND METHOD FOR OPERATING SUCH A MEMORY CELL DEVICE

The invention relates to a memory device with a plurality of memory cells, in particular PCM memory cells, and to a method for operating such a memory device.

In the case of conventional memory devices, in particular conventional semiconductor memory devices, one differentiates between so-called functional memory devices (e.g. PLAs, PALs, etc.), and so-called table memory devices, e.g. ROM devices (ROM=Read Only Memory—in particular PROMs, EPROMs, EEPROMs, flash memories, etc.), and RAM devices (RAM=Random Access Memory or read-write memory, e.g. DRAMs and SRAMs).

A RAM device is a memory for storing data under a predetermined address and for reading out the data under this address later.

In the case of SRAMs (SRAM=Static Random Access Memory), the individual memory cells consist e.g. of few, for instance 6, transistors, and in the case of so-called DRAMs (DRAM=Dynamic Random Access Memory) in general only of one single, correspondingly controlled capacitive element (e.g. the gate-source capacitor of a MOSFET) with the capacitance of which one bit each can be stored as charge.

This charge, however, remains for a short time only. Therefore, a so-called "refresh" must be performed regularly, e.g. approximately every 64 ms.

In contrast to that, no "refresh" has to be performed in the case of SRAMs, i.e. the data stored in the memory cell remain stored as long as an appropriate supply voltage is fed to the SRAM. stored as long as an appropriate supply voltage is fed to the SRAM.

In the case of non-volatile memory devices (NVMs), e.g. EPROMs, EEPROMs, and flash memories, the stored data remain, however, stored even when the supply voltage is switched off.

Furthermore, so-called "resistive" or "resistively switching" memory devices have also become known recently, e.g. so-called Phase Change Memories ("PCMs").

In the case of "resistive" or "resistively switching" memory devices, an "active" or "switching active" material—which is, for instance, positioned between two appropriate electrodes (i.e. an anode and a cathode)—is placed, by appropriate switching processes, in a more or less conductive state (wherein e.g. the more conductive state corresponds to a stored, logic "One", and the less conductive state to a stored, logic "Zero", or vice versa). This may, for instance, correspond to the logic arrangement of a bit.

In the case of phase change memories (PCRAMs), for instance, an appropriate chalcogenide compound may be used as a "switching active" material that is positioned between two corresponding electrodes (e.g. a Ge—Sb—Te ("GST") or an Ag—In—Sb—Te compound)

The chalcogenide compound material is adapted to be placed in an amorphous, i.e. a relatively weakly conductive, or a crystalline, i.e. a relatively strongly conductive state by appropriate switching processes (wherein e.g. the relatively strongly conductive state may correspond to a stored, logic "One", and the relatively weakly conductive state may correspond to a stored, logic "Zero", or vice versa).

Phase change memory cells are, for instance, known from G. Wicker, "Nonvolatile, High Density, High Performance Phase Change Memory", SPIE Conference on Electronics and Structures for MEMS, Vol. 3891, Queensland, 2, 1999, and e.g. from Y. N. Hwang et al., "Completely CMOS Compatible Phase Change Non-volatile RAM Using NMOS Cell Transistors", IEEE Proceedings of the Nonvolatile Semiconductor Memory Workshop, Monterey, 91, 2003, S. Lai et al., "OUM-a 180 nm nonvolatile memory cell element technology for stand alone and embedded applications", IEDM 2001, etc.

In order to achieve, with a corresponding memory cell, a change from an amorphous, i.e. a relatively weakly conductive state of the switching active material, to a crystalline, i.e. a relatively strongly conductive state, an appropriate heating current pulse can be applied at the electrodes, said heating current pulse resulting in that the switching active material is heated beyond the crystallization temperature and crystallizes ("writing process").

Vice versa, a change of state of the switching active material from a crystalline, i.e. a relatively strongly conductive state, to an amorphous, i.e. a relatively weakly conductive state, may, for instance, be achieved in that—again by means of an appropriate heating current pulse—the switching active material is heated beyond the melting temperature and is subsequently "quenched" to an amorphous state by quick cooling ("deleting process").

Phase change memory cells based on this or a corresponding principle are, for instance, described in the publication Y. Ha et al.: "An edge contact type cell for phase change RAM featuring very low power consumption", VLSI 2003, and e.g. in H. Horii et al.: "A novel cell technology using N-doped GeSbTe films for phase change RAM", VLSI 2003, Y. Hwang et al.: "Full integration and reliability evaluation of phase-change RAM based on 0.24 µm-CMOS technologies", VLSI 2003, and S. Ahn et al.: "Highly Manufacturable High Density Phase Change Memory of 64 Mb and beyond", IEDM 2004, etc.

In order that a corresponding memory device can function reliably, the above-mentioned delete or write heating current pulses to be applied to the respective memory cells each have to have heights that have correspondingly been predefined relatively exactly.

The transistors driving the delete or write heating current pulses—e.g. via appropriate bit and ground lines—therefore have to be dimensioned with relatively high accuracy.

A problem is, however, the fact that, due to the electric resistance of the bit and ground lines that must not be neglected, the actual heights of the delete or write heating current pulses that are present at a respective memory cell depend on the position of the respectively controlled memory cell within the memory cell field or cell array, respectively (in particular on the respectively relevant, "effective" bit and ground line lengths, e.g. the length of the respectively relevant ground line section to the respectively driving transistor, and the length of the respectively relevant bit line section to the respective memory cell).

For this reason, it has been suggested to reduce the intensity of the electric resistance of the corresponding lines as much as possible (cf. e.g. W. Cho et al.: "A 0.18 µm 3.0-V 64-Mb nonvolatile phase transition random access memory (PRAM)", IEEE J. Sol. State Circuits 40(1), 293, 2005).

It has further been suggested to make the delete or write voltages used for the respectively driving transistor dependent on the position of the respectively controlled memory cell within the memory cell field (cf. e.g. F. Bedeschi et al.: "A 8 Mb demonstrator for high density 1.8V Phase-change memories", VLSI 2004).

The relatively high switching complexity is i.a. of disadvantage.

It is an object of the invention to provide a novel memory device with a plurality of memory cells, in particular PCM memory cells, and a novel method for operating such a memory device, in particular a method and a memory device with which the above-mentioned disadvantages can be reduced.

This and further objects are achieved by the invention by the subject matters of claims 1 and 17. Advantageous further developments of the invention are indicated in the subclaims.

In accordance with one aspect of the invention there is provided a memory device with a plurality of memory cells which, for controlling, have each at least one switching device, in particular at least one transistor, assigned thereto, as well as a current supply line and a current discharge line, wherein said current supply line and said current discharge line are substantially parallel to each other.

According to a further aspect of the invention there is provided a method for operating a memory device with a plurality of memory cells which, for controlling, have each at least one switching device assigned thereto, wherein the method comprises the steps of:

supplying a current to a respectively selected memory cell via a current supply line; and discharging the current via a current discharge line, wherein said current supply line and said current discharge line are substantially parallel to each other.

Advantageously, the current supply line and the current discharge line are connected at opposing ends of the respective memory cell array.

Thus, it can be achieved that the overall length of the line sections of the current supply and current discharge lines—in particular of corresponding bit and ground lines—which are altogether flown through by the current is independent of the respectively selected memory cell or its position within the memory cell array, respectively.

In the following, the invention will be explained in more detail by means of several embodiments and the enclosed drawing. The drawing shows:

FIG. 1 a schematic representation of an—exemplary—structure of a resistively switching memory cell according to prior art;

FIG. 2 a schematic, exemplary representation of a section of a memory device with a plurality of memory cells according to an embodiment of the present invention;

FIG. 3 a cross-section through a memory device structured in correspondence with the functioning principle illustrated in FIG. 2 according to a first variant;

FIG. 4 a cross-section through a memory device structured in correspondence with the functioning principle illustrated in FIG. 2 according to a second, alternative variant;

FIGS. 5a-5c a plan view of the memory device illustrated in FIG. 3 or FIG. 4, respectively, according to different, alternative layout variants;

FIGS. 5d-5f a plan view of a memory device according to different further, alternative layout variants; and FIG. 6 a cross-section through a memory device structured in correspondence with the functioning principle illustrated in FIG. 2 according to a further, alternative variant.

FIG. 1 shows—purely schematically and for the sake of example—the structure of a resistively switching memory cell 1 (here: of a phase change memory cell 1) according to prior art.

It comprises two appropriate electrodes 2a, 2b (here: two metal electrodes 2a, 2b acting as an anode and as a cathode) with a corresponding, switching active material layer 3 positioned therebetween, said switching active material layer 3 being adapted to be placed in a more or less conductive state by appropriate switching processes (wherein e.g. the more conductive state corresponds to a stored, logic "One" and the less conductive state to a stored, logic "Zero", or vice versa).

With the above-mentioned phase change memory cell 1, an appropriate chalcogenide compound (e.g. a Ge—Sb—Te or an Ag—In—Sb—Te compound) may, for instance, be used as "switching active" material for the above-mentioned material layer 3.

The chalcogenide compound material is adapted to be placed in an amorphous, i.e. a relatively weakly conductive, or a crystalline, i.e. a relatively strongly conductive state by means of appropriate switching processes (wherein e.g. the relatively strongly conductive state may correspond to a stored, logic "One" and the relatively weakly conductive state to a stored logic "Zero", or vice versa).

Phase change memory cells are, for instance, known from G. Wicker, Nonvolatile, High Density, High Performance Phase Change Memory, SPIE Conference on Electronics and Structures for MEMS, Vol. 3891, Queensland, 2, 1999, and e.g. from Y. N. Hwang et al., Completely CMOS Compatible Phase Change Nonvolatile RAM Using NMOS Cell Transistors, IEEE Proceedings of the Nonvolatile Semiconductor Memory Workshop, Monterey, 91, 2003, S. Lai et al., OUM-a 180 nm nonvolatile memory cell element technology for stand alone and embedded applications, IEDM 2001, etc.

As results further from FIG. 1, phase change memory cells 1 may—optionally—be provided with an appropriate heating material layer 5—which has, for instance, a relatively high resistance—below the switching active material layer 3 and above the bottom electrode 2b, said heating material layer 5 being surrounded by an appropriate insulation layer 4.

In order to achieve, with the memory cell 1, a change from an amorphous, i.e. a relatively weakly conductive state of the "active" material, to a crystalline, i.e. a relatively strongly conductive state, an appropriate heating current pulse can be applied at the electrodes 2a, 2b, said heating current pulse resulting in that the heating material layer 5 and regions of the switching active material layer 3 adjacent thereto are correspondingly heated beyond the crystallization temperature of the switching active material, which results in a crystallization of the corresponding regions of the switching active material layer 3 ("writing process").

Vice versa, a change of state of the corresponding regions of the switching active material layer 3 from a crystalline, i.e. a relatively strongly conductive state, to an amorphous, i.e. a relatively weakly conductive state, may, for instance, be achieved by—again by applying an appropriate heating current pulse at the electrodes 2a, 2b and the resulting heating up of the heating material layer 5 and of corresponding regions of the switching active material layer 3—the corresponding regions of the switching active material layer 3 being heated beyond the melting temperature and being subsequently "quenched" to a crystalline state by quick cooling ("deleting process").

FIG. 2 shows—purely schematically and for the sake of example—a section of a memory device according to an embodiment of the present invention.

The memory device comprises—corresponding to conventional memory devices—one or a plurality of cell arrays 10.

In the cell array 10 there are arranged a plurality of memory cells 1—each positioned side by side in a plurality of respectively parallel rows and respectively parallel columns—(for ease of representation, only two out of the plurality of memory cells 1 are illustrated in FIG. 2).

The memory cells 1 may be of a structure that is correspondingly identical with or similar to that described above by means of FIG. 1, or of any other structure.

In order that the memory device can function reliably, the above-mentioned delete or write heating current pulses to be applied to the respective memory cells each have to have heights that have correspondingly been predefined relatively exactly.

As results from FIG. 2, the delete or write heating current pulses are provided by appropriate transistors 13 each driving corresponding bit lines 11 ("BL") and ground lines 12 ("GL").

The bit lines 11 and the ground lines 12 are—as will be explained in more detail in the following—substantially parallel to each other, and each extend substantially over the entire length of the cell array 10.

As results from the explanations below, a plurality of bit lines 11 (e.g. more than 10 or 20 bit lines, etc.) and a plurality of ground lines 12 (e.g. more than 10 or 20 ground lines, etc.) are provided in the cell array 10 (for ease of representation, only the bit line 11 and the ground line 12 are illustrated in FIG. 2).

The number of bit lines 11 may, for example, be equal to the number of ground lines 12.

As will be explained in more detail in the following, the bit lines 11 may (outside the cell array 10) be, for instance, connected to a supply voltage source or current source, respectively, and the ground lines 12 may be connected to the ground.

In order to ensure that the delete or write heating current pluses that are to be applied to the respective memory cells 1 each have correspondingly relatively exactly predefined heights—that are substantially equal for all memory cells 1—the above-mentioned transistors 13 should each be dimensioned with relatively high accuracy—and should all be dimensioned of substantially equal size.

Each of the memory cells 1 is respectively connected to a bit line 11 that is assigned to the respective memory cell 1 (with several memory cells 1 being respectively connected to one and the same bit line 11).

In addition, each of the memory cells 1 is connected to the source drain path of a transistor 13 assigned to the respective memory cell 1.

The source drain path of each transistor 13 is—additionally—connected to a ground line 12 that is assigned to the respective transistor 13 (wherein several transistors 13 or their source drain paths, respectively, are connected to one and the same ground line 12).

The control pins of the transistors 13 are each connected to corresponding word lines 14a, 14b ("WL1", "WL2").

The word lines 14a, 14b are—as will be explained in more detail in the following—substantially parallel to each other, and substantially perpendicular to the bit or ground lines 11, 12, respectively.

As results further from FIG. 2, the word lines 14a, 14b each extend substantially over the entire length of the cell array 10.

As results from the explanations below, a relatively high number of word lines 14a, 14b (e.g. more than 10 or 20 word lines, etc.) may be provided in the cell array 10 (for ease of representation, only the word line 14a and the word line 14b are illustrated in FIG. 2).

If a delete or write heating current pulse is to be applied to a corresponding memory cell 1 (e.g.—in a first example—to the memory cell 1 illustrated at the top in the drawing (or e.g.—in a second example—to the memory cell 1 illustrated at the bottom in the drawing)), an appropriate control signal is applied to the control pin of the transistor 13 assigned to the respective memory cell 1 via the word line 14a, 14b assigned to the respective transistor 13 (thus, in the first example, via the word line 14a illustrated at the top in the drawing an appropriate control signal to the control pin of the transistor 13 illustrated at the top in the drawing, and, in the second example, via the word line 14b illustrated at the bottom in the drawing an appropriate control signal to the control pin of the transistor 13 illustrated at the bottom in the drawing).

In reaction to the control signal, the corresponding transistor 13 changes from a non-conductive state to a conductive state.

As a consequence—in the above-mentioned first example—a corresponding delete or write heating current pulse flows through the bit line 11 (more exactly: a bit line section with a—here relatively small—length a1), the memory cell 1 illustrated at the top in the drawing, the source drain path of the transistor 13 illustrated at the top in the drawing, and the ground line 12 (more exactly: a ground line section with a—here relatively great—length b1).

Contrary to this—in the above-mentioned second example—a corresponding delete or write heating current pulse flows through the bit line 11 or a bit line section, respectively, with a—here relatively great—length a2, the memory cell 1 illustrated at the bottom in the drawing, the source drain path of the transistor 13 illustrated at the bottom in the drawing, and the ground line 12 or a ground line section, respectively, with a—here relatively small—length b2.

As results from FIG. 2 and the explanation above, due to the above-mentioned parallel position of the bit and ground lines 11, 12, the actual height of the delete or write heating current pulse present at the respective memory cell 1 is—irrespective of the electric resistance of the bit and ground lines—substantially independent of the position of the respectively controlled memory cell 1 within the cell array 10 (and thus is substantially equal for all memory cells 1).

This is because the added overall length of the respective bit and ground line sections which are actually flown through by the respective delete or write heating current pulse is—irrespective of the position of the respectively controlled memory cell 1 within the cell array 10—substantially constant.

For the above-mentioned first example there results e.g.—as is shown by FIG. 2—a length of a1+b1 as an added overall length of the bit and ground line sections which are actually flown through by the respective delete or write heating current pulse, and for the above-mentioned second example a—substantially identical—length of a2+b2 as an added overall length of the bit and ground line sections which are actually flown through by the respective delete or write heating current pulse (i.e. there applies that a1+b1≅a2+b2).

FIG. 3 shows a cross-section through a memory device structured in correspondence with the functioning principle illustrated in FIG. 2 according to a first variant.

In the first variant, the ground lines 12 are each arranged above the bit lines 11—that extend parallel thereto—(wherein the bit lines 11 are arranged to be displaced downward in vertical direction vis-à-vis the ground lines 12, namely such that—viewed in cross-section—the plane in which the lower sides of the ground lines 12 are positioned is spaced apart by a distance c from the plane in which the upper sides of the bit lines 11 are positioned).

The height of the ground lines 12 may be substantially identical to the height of the bit lines 11.

Correspondingly—as results, for instance, from FIG. 5a—the breadth of the ground lines 12 may substantially also be identical to the breadth of the bit lines 11 (and/or substantially identical to the breadth of the word lines 14b).

As results further e.g. from FIG. 5a, the ground lines 12 and the bit lines 11 are—viewed from the top—each arranged to be laterally displaced from each other (wherein—viewed from the top—the bit lines 11 each may be displaced vis-à-vis the ground lines 12 by a bit or ground line breadth, respectively).

The outer, lateral, longitudinal edges (respectively lying at the left (or the right) in the Figure) of the ground lines 12 are thus arranged—viewed from above—exactly vertically above corresponding, neighboring longitudinal edges (respectively lying at the right (or the left) in the Figure) of the bit lines 11. Alternatively, the line breadth may also be chosen somewhat smaller than stated above, e.g. for gaining space for a spacer.

Again referring to FIG. 3, an electrode 15—acting as a ground line contact—extends from the ground line 12 perpendicularly downward to the transistor 13.

As results, for instance, from FIG. 5a, the electrode 15—acting as a ground line contact—is arranged to be exactly positioned between two adjacent bit lines 11 (i.e. extends from the ground line 12—passing through between the two adjacent bit lines 11—downward to the transistor 13).

By means of the electrode 15—acting as a ground line contact—an electroconductive connection between the ground line 12 and the transistor 13—more exactly: the source drain path thereof—is provided, without the electrode 15 contacting the above-mentioned two adjacent bit lines 11.

To achieve this—with the above-mentioned relatively narrow displacement between the bit and ground lines 11, 12—, when manufacturing the electrode 15, a corresponding—with regards to the bit lines 11—self-adjusting process conduct method is used. The self-adjustment may e.g. be achieved by that for etching a contact hole for the electrode 15 a nonconducting hard mask and side spacers are applied to the bit lines 11, to which selectively a contact hole etching (oxide) is performed. Alternatively, instead of the side spacers after the contact hole etching an isolating spacer might be given into the contact hole.

As results from FIG. 3, the transistor 13 and the electrode 15 are assigned to two different memory cells 1 that are arranged to be positioned at the right and at the left, respectively, of the electrode 15 in the representation of FIG. 3; the delete or write heating current pulses are each driven by a single transistor 13 ("single-gate" concept).

As results further from FIG. 3, the (top) electrodes 2a of the memory cells 1—which have already been mentioned above and act as cell contacts—extend from the respectively corresponding bit line 11 perpendicularly downward, and the (bottom) electrodes 2b of the memory cells 1—which also act as cell contacts—extend from the transistor 13 perpendicularly upward.

The memory cells 1 may, in principle, be any kind of resistively switching memory cells 1, in particular appropriate phase change memory cells 1 that have been explained in more detail above, for instance, appropriate "heater" or "active-in-via" phase change memory cells, etc., e.g. memory cells with a cell size of 6F2, or less.

As results, for instance, from FIG. 5a, the electrodes 2a, 2b—acting as cell contacts—may each be arranged to be exactly positioned between two adjacent ground lines 12.

By means of the electrode 2a—acting as a cell contact (and being positioned e.g. at the left in the representation of FIG. 3)—, an electroconductive connection is, for instance, provided between the switching active material layer (or the heating material layer 5, respectively) of the memory cell 1 (that is positioned e.g. at the left in the drawing) and the bit line 11 illustrated in FIG. 3, and, by means of the electrode 2a (that is positioned e.g. at the right in the representation of FIG. 3), an electroconductive connection is, for instance, provided between the switching active material layer (or the heating material layer 5, respectively) of the memory cell 1 (that is e.g. positioned at the right in the drawing) and a bit line that is adjacent to the bit line 11 illustrated in FIG. 3.

Correspondingly, by means of the electrodes 2b—also acting as cell contacts—a respective electroconductive connection is provided between the switching active material layer (or the heating material layer 5, respectively) of the respective memory cell 1 and the transistor 13 (more exactly: the source drain path thereof).

The electrodes 15 or 2a, 2b, respectively, may, in principle, be manufactured of any kind of suitable electrode materials, e.g. of a titanium compound such as TiN, TiSiN, TiAlN, TaSiN, or TiW, etc., or e.g. tungsten.

The memory cells 1 and the electrode 15 as well as the bit lines 11 and the ground lines 12 are electrically insulated from each other by an appropriate insulating material 16 surrounding the memory cells 1 and the electrode 15, respectively, as well as the bit and ground lines 11, 12.

As an insulating material 16, e.g. $SiO_2$ may be used, or any other, suitable insulating material.

FIG. 4 shows a cross-section through a memory device structured in correspondence with the functioning principle illustrated in FIG. 2 according to a second variant that is an alternative to the first variant illustrated in FIG. 3.

The memory device according to the second variant is of a correspondingly similar or identical structure as the memory device of the first variant.

However, the ground lines 12' that are parallel to the bit lines 11' are not each arranged to be positioned above, but below the bit lines 11', and the memory cells 1' are not arranged to be positioned below the bit and ground lines 11', 12', but in a plane between the bit lines 11' and the ground lines 12'.

The ground lines 12' are arranged to be displaced downward in vertical direction vis-à-vis the bit lines 11' such that—viewed in cross-section—the plane in which the lower sides of the bit lines 11' are positioned is spaced apart by a distance c' from the plane in which the upper sides of the ground lines 12' are positioned.

The height and the breadth of the ground lines 12' may be substantially identical to the height and the breadth of the bit lines 11'.

The ground lines 12' and the bit lines 11' each are—correspondingly to what has been explained above, and as is, for instance, illustrated in FIG. 5a—, viewed from the top, arranged to be displaced laterally from each other (wherein—viewed from the top—the bit lines 11' each may be displaced vis-à-vis the ground lines 12' by a bit or ground line breadth, respectively).

As results from FIG. 4, an electrode 15'—acting as a ground line contact—extends from the ground line 12' perpendicularly downward to the transistor 13'.

As results, for instance, from FIG. 5, the electrode 15'—acting as a ground line contact—may be arranged to be exactly positioned between two adjacent bit lines 11'.

By means of the electrode 15'—acting as a ground line contact—an electroconductive connection is provided between the ground line 12' and the transistor 13'—more exactly: the source drain path thereof.

As results further from FIG. 4, the (top) electrodes 2a' of the memory cells 1'—which act as cell contacts—extend from the respectively corresponding bit line 11' perpendicularly downward, and the (bottom) electrodes 2b' of the memory cells 1'—which also act as cell contacts—extend from the transistor 13' perpendicularly upward.

As results, for instance, from FIG. 5a, the electrodes 2a', 2b'—acting as cell contacts—may each be arranged to be exactly positioned between two adjacent ground lines 12'.

Thus, it is achieved that the bottom electrodes 2b'—acting as cell contacts—extend from the transistor 13'—passing through between the two adjacent ground lines 12'—upward to the switching active material layer (or to the heating material layer 5, respectively) of the respective memory cell 1.

By means of the electrodes 2b'—acting as cell contacts—a respective electroconductive connection is provided between the switching active material layer (or the heating material layer 5, respectively) of the respective memory cell 1' and the transistor 13' (more exactly: with the source drain path thereof) without the electrodes 2b' contacting the above-mentioned two adjacent ground lines 12'.

Correspondingly similar, by means of the electrode 2a' (that is, for instance, positioned at the left in the representation of FIG. 4), an electroconductive connection is, for instance, provided between the switching active material layer (or the heating material layer 5, respectively) of the memory cell 1' (that is, for instance, positioned at the left in the drawing) and the bit line 11' illustrated in FIG. 4, and by means of the electrode 2a' (that is, for instance, positioned at the right in the representation of FIG. 4), an electroconductive connection is, for instance, provided between the switching active material layer (or the heating material layer 5, respectively) of the memory cell 1' (that is, for instance, positioned at the right in FIG. 4) and a bit line that is adjacent to the bit line 11' illustrated in FIG. 4.

Both with the variant illustrated in FIG. 3 and with the variant illustrated in FIG. 4, for generating an appropriate delete or write heating current pulse—as is usually done—an appropriate supply voltage Vb1—generated by the above-mentioned supply voltage source or current source, respectively—may be applied to the bit line 11, 11', and the ground line 12, 12' may remain connected with the ground—the voltage present at the bit line will then change, for instance, from 0V (ground potential) to Vb1; the voltage present at the ground line remains constant at 0V (mode 1).

Alternatively, for generating an appropriate delete or write heating current pulse, both the potential of the bit and the ground line may be changed. For instance, first a (corresponding identical) middle voltage may be applied both to the bit and the ground line 12, 12'; thereafter, an appropriate supply voltage Vb1—generated by the above-mentioned supply voltage source or current source, respectively—may be applied to the bit line 11, 11', and the ground line 12, 12' may be connected with the ground—the voltage present at the bit line will then change, for instance, from Vb1/2 to Vb1 and the voltage present at the ground line from Vb1/2 to 0V (mode 1').

As the power consumption substantially is proportional to the square of the voltage level difference, the power consumption may thereby be reduced (from about $Vb1^2$ to about $2\times(Vb1/2)^2$).

With a further alternative, the roles of the bit and ground lines 11, 11', 12, 12' may be exchanged:

For generating an appropriate delete or write heating current pulse, an appropriate supply voltage Vb1—generated by the above-mentioned supply voltage source or current source, respectively—may be applied to the ground line 12, 12', and the bit line 11, 11' remains connected constantly with the ground—the voltage present at the ground line will then change, for instance, from 0V to Vb1; the voltage present at the bit line remains constant at 0V (mode 2).

Alternatively,—again—both the potential of the bit and the ground line may be changed: For instance, first a (corresponding identical) middle voltage may be applied both to the bit and the ground line 12, 12'; thereafter, an appropriate supply voltage Vb1—generated by the above-mentioned supply voltage source or current source, respectively—may be applied to the ground line 12, 12', and the bit line 11, 11' may be connected with the ground—the voltage present at the ground line will then change, for instance, from Vb1/2 to Vb1 and the voltage present at the bit line from Vb1/2 to 0V (mode 2').

In a further alternative, the memory device—in particular a corresponding bit and ground line 11, 11', 12, 12'—may be operated optionally selectively in the above-mentioned modes 1, 1', 2, or 2', for instance respectively alternately in mode 1 and 2, or—especially advantageously—respectively alternately in mode 1' and 2' (bidirectional operation of the memory cells 1, 1').

By the fact that the bit line 11, 11' is optionally selectively (e.g. respectively alternately) also operated like a conventional ground line, and the ground line 12, 12' is, vice versa, optionally selectively also operated like a conventional bit line, the danger of migration errors and the danger of a hot electron damage of the respective transistor gate, etc. can be reduced.

As results, for instance, from FIG. 5a, the vertical central axes of two respective memory cells 1 that are each assigned to one and the same transistor 13 (or the vertical central axes of the first and second electrode pairs 2a, 2b of two respective memory cells 1 that are each assigned to one and the same transistor 13, respectively)—and/or the vertical central axes of the first and/or second electrode pair 2a, 2b acting as cell contacts, and the assigned electrode 15 acting as a ground line contact—may each be positioned in a vertical plane (illustrated in dashed line in FIG. 5a), said plane being arranged at an angle relative to the longitudinal axes (also illustrated in dashed line in FIG. 5a) of the bit and ground lines 11, 12).

As results, for instance, from FIG. 5a, with the embodiments explained here, the vertical central axes of the first and second electrode pairs 2a, 2b of two respective memory cells 1 that are each assigned to one and the same transistor 13, and the central axis of the assigned electrode 15 acting as a ground line contact are positioned in one and the same vertical plane (illustrated in dashed line in FIG. 5a).

The angle $\alpha$ included between the above-mentioned vertical plane(s) and the longitudinal axes of the bit and ground lines 11, 12 may, for instance, be between 15° and 75°, in particular e.g. between 20° and 50°, etc.

The above-mentioned transistors 13 (or the electrodes 2a, 2b, 15, respectively) are each arranged to be positioned in active regions 17 that are illustrated with a bold frame in FIG. 5a.

The active regions 17 are each surrounded by insulating STI (Shallow Trench Isolation) regions positioned between corresponding active regions 17.

The active regions 17 substantially are—viewed from a lithographic standpoint—(and as is explained in further detail below) corresponding (angled) line layer planes (and not isolated (2-dimensional) structures).

As results from FIG. 5a, with the embodiments explained here, not only one respective single transistor 13 (or the electrodes 2a, 2b, 15 assigned thereto and acting as ground line contact and cell contacts) is/are arranged in one and the same active region 17.

Instead, a first partial section 17a ("first main section 17a") of an active region 17, which covers a respective single transistor 13 extends—in the representation of FIG. 5a upward and downward—over corresponding second partial sections 17b ("intermediate section 17b") on to corresponding third partial sections 17c of the active region 17 (i.e. to further main sections 17c) which each cover a further transistor 13 (or the electrodes 2a, 2b, 15 assigned thereto and acting as ground line contact and cell contacts, respectively), and from there over a corresponding further intermediate section to a further main section, etc., etc. As results from FIG. 5a, the longitudinal axes of the above-mentioned intermediate sections 17b of the active region 17 are, for instance, each parallel to the longitudinal axes of the bit and ground lines 11, 12.

In contrast to this, the longitudinal axes of the above-mentioned main sections 17a, 17c of the active region 17 each are diagonal to the longitudinal axes of the bit and ground lines 11, 12 (namely each such that the above-mentioned angle α is included between the longitudinal axes of the main sections 17a, 17c of the active region 17 and the longitudinal axes of the bit and ground lines 11, 12).

Thus, in an overall view, there results a course of the active region 17 over the cell array 10 which assumes roughly the shape of a sinuous line.

To keep respectively adjacent main sections 17a, 17c of an active region which are part of one and the same active region 17 and are connected with each other via a corresponding intermediate section 17b electrically insulated from each other, a respective insulation gate region 18 that is in a permanent electric off-state (and that extends transversely to the ground and bit lines) is provided between the corresponding main sections 17a, 17c—i.e. in the respective intermediate section 17b.

FIGS. 5b and 5c show alternative layout variants of the memory device illustrated in FIG. 5a.

The memory device illustrated in FIG. 5b is of a correspondingly similar or identical structure as the memory device illustrated in FIG. 5a.

However, in the layout variant illustrated in FIG. 5b, the longitudinal axes (illustrated in dashed line in FIG. 5b) of corresponding main sections 17a', 17c' of corresponding active regions 17' do not all extend equally diagonally to the longitudinal axes (illustrated in dashed line in FIG. 5b) of the bit and ground lines 11, 12, but such that a positive and a negative angle +α, −α are included alternately between the longitudinal axes of the main sections 17a', 17c' of a respective active region 17' and the longitudinal axes of the bit and ground lines 11, 12 (wherein +α may, for instance, be between +15° and +75°, in particular e.g. between +20° and +50°, and −α e.g. between −15° and −75°, in particular e.g. between −20° and −50°, etc.).

Thus, in an overall view, there results a course of the active region 17 over the cell array 10 which assumes roughly the shape of a zigzag.

The memory device illustrated in FIG. 5c is structured correspondingly similar or identical as the memory device illustrated in FIG. 5b.

However, the bit and ground lines 11, 12 do not proceed continuously in a straight line.

Instead, between the longitudinal axes (illustrated in dashed line in FIG. 5c) of first sections 11a, 12a of the bit and ground lines 11, 12—which are arranged in the region close to the main sections 17a", 17c" of corresponding active regions 17'"—and the longitudinal axes (illustrated in dashed line in FIG. 5c) of second sections 11b, 12b of the bit and ground lines 11, 12—which are arranged in the region close to the intermediate sections 17b" of corresponding active regions 17", a positive and a negative angle +β, −β each are included alternately.

The angle +β may, for instance, be between +10° and +60°, in particular e.g. between +15° and +45°, and −β e.g. between −10° and −60°, in particular e.g. between −15° and −45°, etc.

Furthermore, the longitudinal axes (illustrated in dashed line in FIG. 5c) of corresponding main sections 17a", 17c" of corresponding active regions 17" proceed, in the layout variant illustrated in FIG. 5c—correspondingly similar to the layout variant illustrated in FIG. 5b—such that a positive and a negative angle +α, −α each are included alternately—but each in the opposite direction to the bit and ground lines—between the longitudinal axes of the main sections 17a", 17c" of a respective active region 17" and the longitudinal axes of the intermediate sections 17c" of a respective active region 17".

Thus, in an overall view, there results a course of the active region 17" over the cell array 10 which assumes roughly the shape of a zigzag, and a course of the bit and ground lines 11, 12 which assumes the shape of a zigzag in the opposite direction thereto.

FIGS. 5d, 5e, 5f show further alternative layout variants of a memory device according to the present invention.

The memory devices illustrated in FIGS. 5d, 5e, 5f are of a correspondingly similar or identical structure as the above-explained memory devices. However—other than with the above-explained memory devices—every two memory cells 1 share, instead of one respective single electrode 15, two respective electrodes 15 acting as ground line contacts. The delete or write heating current pulses are driven by two respective transistors instead of by one respective single transistor ("dual-gate" concept).

The respectively used memory cells may comprise correspondingly larger cell sizes than described above, e.g. 8F2 (or less).

In the layouts illustrated in FIG. 5e and FIG. 5f, the bit and ground lines 11, 12 proceed (—corresponding to the layouts illustrated in FIG. 5a and FIG. 5b—) continuously in a straight line.

Furthermore, in the layouts illustrated in FIG. 5e and FIG. 5f, a corresponding memory cell 1—that comprises corresponding electrodes 2a, 2b acting as cell contacts—is fed by two respective transistors, wherein the first transistor is fed via a respective electrode 15a acting as a ground line contact and the second transistor is fed via a respective electrode 15b acting as a ground line contact.

As results from FIG. 5e and FIG. 5f, the two electrodes 15a, 15b—acting as ground line contacts—of the two transistors feeding the memory cell 1 are each connected with one and the same ground line 12.

In the layout illustrated in FIG. 5e, the electrode 2b of the memory cell 1—which acts as a cell contact—is connected with another bit line 11 than the memory cell or electrode 2b', respectively, that is assigned to the same active region 17 and that is directly following the memory cell 1 or the electrode 2b, respectively (instead with the bit line 11, it is connected with a bit-line 11' that is adjacent thereto).

In contrast to this, in the alternative layout illustrated in FIG. 5f, the electrode 2b of the memory cell 1—which acts as a cell contact—is connected with one and the same bit line 11 as the memory cell or electrode 2b", respectively, that is assigned to the same active region 17' and that is directly following the memory cell 1 or the electrode 2b, respectively.

Thus, in an overall view, for the layouts illustrated in FIG. 5e and in FIG. 5f there results a course of the active region 17, 17' over the cell array 10 which assumes roughly the shape of a zigzag, wherein the active region 17, 17', in the layout illustrated in FIG. 5e, changes its direction after every second word line 14b, and in the layout illustrated in FIG. 5f twice as often (after every word line 14b).

In the layout illustrated in FIG. 5d, the bit and ground lines 11, 12 do (—corresponding to the layout illustrated in FIG. 5c—) not proceed continuously in a straight line.

Instead, a positive and a negative angle +β, −β are each included alternately between the longitudinal axes (illustrated in dashed line in FIG. 5d) of respectively successive bit and ground line sections 11a, 12a and a line that extends perpendicularly to the word lines 14b (illustrated in dashed line in FIG. 5d).

Correspondingly, a positive and a negative angle +α, −α are each included alternately—but each in opposite direction to the bit and ground lines—between the longitudinal axes (illustrated in dashed line in FIG. 5d) of respectively successive sections 17a, 17b of corresponding active regions 17 and the above-mentioned line that extends perpendicularly to the word lines 14b (illustrated in dashed line in FIG. 5d).

Thus, in an overall view, there results a course of the active region 17 over the cell array 10 which assumes roughly the shape of a zigzag, and a course of the bit and ground lines 11, 12 which assumes the shape of a zigzag in the opposite direction.

FIG. 6 shows a cross-section through a memory device structured in correspondence with the functioning principle illustrated in FIG. 2 according to a further variant that is an alternative to the variants illustrated in FIG. 3 and FIG. 4.

The memory device according to the further variant is substantially of a correspondingly similar or identical structure as the memory device of the second variant illustrated in FIG. 4.

The ground lines 12' that are parallel to the bit lines 11' are each arranged to be positioned below the bit lines 11', and the memory cells 1', 1" are positioned in a plane between the bit lines 11' and the ground lines 12'.

The memory cells 1', 1" each comprise a heating material layer 5', 5" and an adjacent switching active material layer 3', 3", in particular a corresponding phase change material layer 3', 3".

As results from FIG. 6, an electrode 15'—acting as a ground line contact—extends from the ground line 12' perpendicularly downward to the transistor 13'.

As results further from FIG. 6, a top region of the switching active material layer 3', 3" of the memory cells 1', 1" directly contacts the bit line 11'.

The (bottom) electrodes 2b' of the memory cells 1', 1"—which act as cell contacts—extend from the heating material layer 5', 5" perpendicularly downward to the transistor 13'.

The transistor 13' that is assigned to the two memory cells 1' is arranged in an active region 17' in which—apart from the transistor 13'—further transistors are arranged which are not assigned to the two memory cells 1', but to corresponding, further memory cells 1".

To keep respectively adjacent partial sections of the active region 17' which are each assigned to different transistors electrically insulated from each other, a corresponding insulation gate region 18' that is in a permanent electric off-state is respectively provided between the partial regions (or between respectively adjacent active gate regions 19' of the partial regions, respectively).

The invention claimed is:

1. A memory device comprising:
   a plurality of memory cells;
   each of the memory cells having at least one-switching device assigned thereto for controlling;
   a plurality of current supply lines;
   a plurality of current discharge lines arranged substantially parallel to the current supply lines, the current supply lines and the current discharge lines being situated on different first and second planes;
   the switching device being arranged in an active region that is at least partly angled with respect to the current supply lines and the current discharge lines; and
   a contact device that extends from one of the current supply lines or the current discharge lines of the first plane, between two adjacent current supplies or current discharge lines of the second plane, to the switching device.

2. The memory device according to claim 1, wherein the memory cells are resistively switching memory cells.

3. The memory device according to claim 1, wherein the memory cells are PCM memory cells.

4. The memory device according to claim 1, wherein said current supply lines are bit lines.

5. The memory device according to claim 1, wherein said current discharge lines are ground lines.

6. The memory device according to claim 1, said memory device being designed and equipped such that said current supply line is adapted to be operated optionally selectively also as current discharge line.

7. The memory device according to claim 1, said memory device being designed and equipped such that said current discharge lines are adapted to be operated optionally selectively also as current supply lines.

8. The memory device according to claim 1, wherein the active region is situated at an angle (α) between 15° and 75° to said current supply and current discharge lines.

9. The memory device according to claim 8, wherein the angle (α) is between 20° and 50°.

10. The memory device according to claim 8, wherein said active region proceeds substantially in zigzag shape.

11. The memory device according to claim 8, wherein said active region proceeds substantially in a shape of a sinuous line.

12. The memory device according to claim 8, wherein said active region comprises at least a first and a second partial region, wherein said switching device is arranged in said first partial region and a further switching device is arranged in said second partial region, and wherein the two partial regions are electronically insulated from each other by an insulation gate region.

13. The memory device according to claim 1, wherein, for controlling said switching device, a control line is provided, and wherein said current supply and current discharge lines proceed at least in sections at an angle to said control lines.

14. The memory device according to claim 13, wherein the angle is between 15° and 80°, in particular between 30° and 75°.

15. The memory device according to claim 1, wherein, for controlling said switching device, a control line is provided which proceeds substantially perpendicularly to said current supply and current discharge lines.

16. The memory device according to claim 1, wherein the current supply line—viewed from the top—is arranged displaced from the current discharge line by substantially a current supply or current discharge line breadth.

17. A method for operating a memory device with a plurality of memory cells which each have at least one switching device assigned thereto for controlling, the switching device being arranged in an active region, wherein the method comprises the steps of:
   supplying a current to a respectively selected memory cell via one of a plurality of current supply lines; and
   discharging the current via one of a plurality of current discharge lines, wherein said current supply lines and said current discharge lines are substantially parallel to each other and situated on different first and second planes, wherein the active region is at least party angled with respect to the current supply lines and the current discharge lines; and wherein a contact device extends from one of the current supply lines or the current discharge lines of the first plane, between two adjacent current supply or current discharge lines of the second plane, to the switching device.

18. The method according to claim 17, wherein the overall length of the line sections of said current supply and current discharge lines that are altogether flown through by the current is independent of the respectively selected memory cell.

19. The method according to claim 17, wherein the memory cells are resistively switching memory cells.

20. The method according to claim 17, wherein the memory cells are PCM memory cells.

21. The method according to claim 17, said method additionally comprising the step of: operating said current supply line additionally also as current discharge line.

22. The method according to claim 17, said method additionally comprising the step of: operating said current discharge line additionally also as current supply line.

23. The method according to claim 21, wherein, during a first access of the memory cell, said current supply line is operated as current supply line and said current discharge line as current discharge line and, during a second, in particular subsequent access of the memory cell, said current supply line is operated as current discharge line and said current discharge line as current supply line.

24. The method according to claim 21, wherein for operating said current supply line as current discharge line and said current discharge line as current supply line both a voltage (Vbl/2) applied to the current supply line and to the current discharge line is changed.

25. The method according to claim 24, wherein for operating said current supply line as current discharge line and said current discharge line as current supply line first as identical voltage (Vbl/2) is applied to the current supply line and to the current discharge line, and then the voltage applied to the current supply line is increased, and the voltage applied to the current discharge line is decreased.

26. The method according to claim 24, wherein for operating said current supply line as current discharge line and said current discharge line as current supply line first an identical voltage (Vbl/2) is applied to the current supply line and to the current discharge line, and then the voltage applied to the current supply line is decreased, and the voltage applied to the current discharge line is increased.

* * * * *